United States Patent

Sato

(10) Patent No.: US 7,804,095 B2
(45) Date of Patent: Sep. 28, 2010

(54) IMAGE DISPLAY DEVICE AND MANUFACTURING METHOD FOR THE SAME

(75) Inventor: Takeshi Sato, Mobara (JP)

(73) Assignee: Hitachi Displays, Ltd., Chiba (JP)

( * ) Notice: Subject to any disclaimer, the term of this patent is extended or adjusted under 35 U.S.C. 154(b) by 0 days.

(21) Appl. No.: 12/502,401

(22) Filed: Jul. 14, 2009

(65) Prior Publication Data

US 2010/0012940 A1      Jan. 21, 2010

(30) Foreign Application Priority Data

Jul. 18, 2008   (JP) ............................ 2008-187246

(51) Int. Cl.
*H01L 31/00* (2006.01)
*H01L 31/036* (2006.01)
*H01L 27/14* (2006.01)
*H01L 29/04* (2006.01)
*H01L 21/339* (2006.01)

(52) U.S. Cl. .............. 257/59; 257/52; 257/72; 257/66; 257/E21.372; 257/E21.411; 438/149; 438/151

(58) Field of Classification Search .......... 257/E21.372, 257/E21.411
See application file for complete search history.

(56) References Cited

U.S. PATENT DOCUMENTS

| 6,759,283 | B2 | 7/2004 | Yasuda et al. |
| 7,145,176 | B2 | 12/2006 | Kawasaki et al. |
| 7,432,906 | B2 | 10/2008 | Nakajima et al. |
| 7,636,078 | B2 * | 12/2009 | Yamazaki et al. ............ 345/100 |
| 2001/0009283 | A1 * | 7/2001 | Arao et al. .................. 257/303 |
| 2005/0206640 | A1 * | 9/2005 | Miyamoto et al. .......... 345/211 |
| 2007/0001236 | A1 * | 1/2007 | Yamazaki et al. ........... 257/391 |
| 2007/0070020 | A1 |  3/2007 | Edo et al. |

FOREIGN PATENT DOCUMENTS

| JP | 2002-175053 | 6/2002 |
| JP | 2002-305306 | 10/2002 |
| JP | 2003-037270 | 2/2003 |
| JP | 2006-174294 | 6/2006 |
| JP | 2007-095190 | 4/2007 |

* cited by examiner

*Primary Examiner*—Charles D Garber
*Assistant Examiner*—Mohsen Ahmadi
(74) *Attorney, Agent, or Firm*—Antonelli, Terry, Stout & Kraus, LLP.

(57) ABSTRACT

Provided is an image display device comprising, on a TFT substrate: a plurality of gate lines and a plurality of drain lines which intersect with each other; a pixel TFT provided within a pixel which is enclosed by a pair of adjacent gate lines and a pair of adjacent drain lines; a gate driver TFT which is connected to one of the plurality of gate lines to drive the one of the plurality of gate lines, wherein the pixel TFT and the gate driver TFT each include an amorphous semiconductor film as a channel, wherein the pixel TFT has a bottom gate structure, wherein the gate driver TFT has a dual gate structure, and wherein a mobility on a top surface side of the semiconductor film of the gate driver TFT is higher than a mobility on a top surface side of the semiconductor film of the pixel TFT.

8 Claims, 9 Drawing Sheets

PIXEL TFT

GATE DRIVER TFT

GATE DRIVER TFT

PIXEL TFT        GATE DRIVER TFT

IMAGE DISPLAY DEVICE AND MANUFACTURING METHOD FOR THE SAME

CROSS-REFERENCE TO RELATED APPLICATION

The present application claims priority from Japanese application JP 2008-187246 filed on Jul. 18, 2008, the content of which is hereby incorporated by reference into this application.

BACKGROUND OF THE INVENTION

1. Field of the Invention

The present invention relates to an image display device and a manufacturing method therefor. More particularly, the present invention relates to an image display device with a built-in driver circuit which includes a driver circuit on a substrate, and a method of manufacturing the image display device.

2. Description of the Related Art

There has been known a type of liquid crystal display device which uses a thin film transistor (hereinafter may simply be referred to as TFT) with a semiconductor film made of amorphous silicon, especially a bottom gate TFT which includes a gate electrode provided on a substrate side with respect to the semiconductor film (underside of the semiconductor film), as a switching element for driving a pixel (a TFT as this may hereinafter be referred to as pixel TFT).

Channel etch TFTs are known as one of the above-mentioned bottom gate TFTs. A channel etch TFT is formed by: forming a layered structure through sequential patterning of a gate, a gate insulator film, a semiconductor film, and a contact layer; forming a metal film in a manner that covers the sequentially layered structure; processing the metal film to form a source and a drain; and etching portions of the contact layer that are not covered with the source and drain electrodes, along with part of the semiconductor film formed below the etched contact layer.

In a TFT having this structure, an influence of an electric field from the gate electrode hardly reaches a front side of the semiconductor film (herein, a top side of a semiconductor film is the front side), whereas the influence of an electric field from above often reaches the front side of the semiconductor film, resulting in a problem that leak current occurs on the front side of the semiconductor film.

An example of solutions to this inconvenience is disclosed in JP 2002-305306 A, in which the front side of the semiconductor film is made porous and accordingly low in mobility, to thereby reduce leak current due to an external electric field. Other known methods involving forming a low-mobility layer than the ion irradiation method described in JP 2002-305306 A include one disclosed in JP 2003-37270 A which uses oxygen plasma and hydrogen plasma.

JP 2007-95190 A discloses a liquid crystal display device having a built-in driver circuit with a TFT using an amorphous Si semiconductor film. In JP 2007-95190 A and in JP 2002-175053 A, a dual gate TFT which has gates above and below the semiconductor film constitutes a part of the driver circuit of the liquid crystal display device.

In the above-mentioned image display devices, forming a circuit that drives a gate of a pixel with an amorphous silicon TFT (a TFT for this use is hereinafter referred to as gate driver TFT) makes the gate driver TFT, which writes in a gate line, large in size and increases a circuit width.

A TFT using a semiconductor film that is made of polycrystalline silicon, on the other hand, is superior in driving power and reduced in TFT size. However, manufacturing a polycrystalline silicon TFT requires processes that are not employed in a manufacture line for an amorphous silicon TFT, such as crystallization, impurity implantation, and activation.

The driving power of a gate driver TFT can be improved by forming a top gate above the semiconductor film of the gate driver TFT with a second gate insulator film interposed therebetween, thus giving the gate driver TFT a dual gate TFT structure in which a channel is formed on the front side of the semiconductor film as well. This is because the mobility on the front side of the semiconductor film is desirably high in order to improve the driving power. On the other hand, low mobility on the front side of the semiconductor film is desirable in a TFT that is used as a pixel switch and needs to suppress leak current.

In the conventional liquid crystal display devices, no consideration has been given to differentiate the mobility on the front side of the semiconductor film of a pixel TFT from the mobility on the front side of the semiconductor film of a gate driver TFT by, for example, employing different processes. Consequently, combining different characteristics required of the two TFTs has been difficult.

SUMMARY OF THE INVENTION

It is therefore an object of the present invention to provide an image display device capable of suppressing leakage in a pixel TFT while being improved in driving power of a gate driver TFT, and a method of manufacturing the image display device.

A liquid crystal display device according to the present invention is capable of suppressing leakage in a pixel TFT and of improving the driving power of a gate driver TFT by forming a low mobility layer on a front side of a semiconductor film of the pixel TFT while forming no low mobility layer on a front side of a semiconductor film of the gate driver TFT, which has a dual gate structure, or selectively removing a low mobility layer from the front side of the semiconductor film of the gate driver TFT.

At the time when a low mobility layer is formed on the front side of the semiconductor film of the pixel TFT, the front side of the semiconductor film of the gate driver TFT is protected, whereby a low mobility layer is formed only in the pixel TFT. The mobility on the front side of the semiconductor film of the gate driver TFT is thus made higher than the mobility on the front side of the semiconductor film of the pixel TFT. The mobility on the front side of the semiconductor film of the gate driver TFT can be made higher than the mobility on the front side of the semiconductor film of the pixel TFT also by forming a low mobility layer on the front side of each of the semiconductor films of the pixel TFT and the gate driver TFT, and then etching the low mobility layer on the front side of the semiconductor film of the gate driver TFT alone.

Alternatively, the mobility on the front side of the semiconductor film of the gate driver TFT can be made higher than the mobility on the front side of the semiconductor film of the pixel TFT by forming the TFTs in a manner that forms a source and a drain for the pixel TFT, as well as a low mobility layer on the front side of the semiconductor film of the pixel TFT, and then forms a source and a drain for the gate driver TFT, with the pixel TFT being protected. Another way to make the mobility on the front side of the semiconductor film of the gate driver TFT higher than the mobility on the front side of the semiconductor film of the pixel TFT is to form the TFTs in a manner that forms a source and a drain for the gate driver TFT, and then forms a source and a drain, as well as a low mobility layer on the semiconductor film, for the pixel TFT, with the gate driver TFT being protected.

For example, the present invention may be structured as follows.

(1) An image display device according to the present invention comprises, for example, on a TFT substrate: a plurality of gate lines and a plurality of drain lines which intersect with each other; a pixel TFT provided within a pixel which is enclosed by a pair of adjacent gate lines and a pair of adjacent drain lines; a gate driver TFT which is connected to one of the plurality of gate lines to drive the one of the plurality of gate lines; and a shift register for selecting one of the plurality of gate lines through the gate driver TFT, wherein the pixel TFT and the gate driver TFT each include an amorphous semiconductor film as a channel, wherein the pixel TFT has a bottom gate structure in which a gate of the pixel TFT is formed below the amorphous semiconductor film, wherein the gate driver TFT has a dual gate structure in which a gate of the gate driver TFT is formed below the semiconductor film and another gate of the gate driver TFT is formed above the semiconductor film, and wherein a mobility on a top surface side of the semiconductor film of the gate driver TFT is higher than a mobility on a top surface side of the semiconductor film of the pixel TFT.

(2) In the image display device according to Item (1), the pixel TFT and the gate driver TFT each may include a contact layer which is interposed between a source thereof and the semiconductor film, and between a drain thereof and the semiconductor film.

(3) In the image display device according to Item (1), a thickness of the amorphous semiconductor film formed in a region that is not covered with the source and drain of the pixel TFT may be larger than a thickness of the amorphous semiconductor film formed in a region that is not covered with the source and drain of the gate driver TFT.

(4) In the image display device according to Item (1), the TFT substrate may face a counter substrate across a liquid crystal.

(5) According to the present invention, there is provided a method of manufacturing an image display device that comprises, for example, on the same substrate, a bottom gate type pixel TFT, which includes a gate thereof below a semiconductor film, and a dual gate type gate driver TFT, which has a gate thereof below a semiconductor film and another gate thereof above the semiconductor film, the method comprising: forming a semiconductor layer and a contact layer sequentially to form a sequentially layered structure for each of the bottom gate type pixel TFT and the dual gate type gate driver TFT; forming a source and a drain on the sequentially layered structure of the bottom gate type pixel TFT, and then etching an exposed part of the contact layer which is not covered with the source and drain of the bottom gate type pixel TFT until the semiconductor film formed below the contact layer is exposed; forming a source and a drain on the sequentially layered structure of the dual gate type gate driver TFT, and then etching an exposed part of the contact layer which is not covered with the source and drain of the dual gate type gate driver TFT until the semiconductor film formed below the contact layer is exposed; and forming, while covering at least a region for forming the dual gate type gate driver TFT with a mask, a low mobility layer on an exposed semiconductor film surface which is not covered with the source and drain of the bottom gate type pixel TFT.

(6) According to the present invention, there is provided a method of manufacturing an image display device that comprises, for example, on the same substrate, a bottom gate type pixel TFT, which includes a gate thereof below a semiconductor film, and a dual gate type gate driver TFT, which has a gate thereof below a semiconductor film and another gate thereof above the semiconductor film, the method comprising: forming a semiconductor layer and a contact layer sequentially to form a sequentially layered structure for each of the bottom gate type pixel TFT and the dual gate type gate driver TFT; forming, in each of the bottom gate type pixel TFT and the dual gate type gate driver TFT, a source and a drain on the sequentially layered structure, and then etching an exposed part of the contact layer which is not covered with the source and the drain until the semiconductor film formed below the contact layer is exposed; forming a low mobility layer on an exposed semiconductor film surface that is not covered with the source and drain of the bottom gate type pixel TFT and on an exposed semiconductor film surface that is not covered with the source and drain of the dual gate type gate driver TFT; and removing, while covering at least a region for forming the bottom gate type pixel TFT with a mask, the low mobility layer that has been formed on the semiconductor film surface of the dual gate type gate driver TFT.

(7) The method of manufacturing the image display device according to Item (5) may comprise: forming, while covering a region for forming the dual gate type gate driver TFT with a first mask, a source and a drain on the sequentially layered structure in a region for forming the bottom gate type pixel TFT, and then etching an exposed part of the contact layer which is not covered with the source and drain of the bottom gate type pixel TFT until the semiconductor film formed below the contact layer is exposed, to form a low mobility layer on an exposed semiconductor film surface which is not covered with the source and drain of the bottom gate type pixel TFT; and forming, while covering the region for forming the bottom gate type pixel TFT with a second mask, a source and a drain on the sequentially layered structure in the region for forming the dual gate type gate driver TFT, and then etching an exposed part of the contact layer which is not covered with the source and drain of the dual gate type gate driver TFT until the semiconductor film formed below the contact layer is exposed.

(8) The method of manufacturing the image display device according to Item (5) may comprise: forming, while covering a region for forming the bottom gate type pixel TFT with a first mask, a source and a drain on the sequentially layered structure in a region for forming the dual gate type gate driver TFT, and then etching an exposed part of the contact layer which is not covered with the source and drain of the dual gate type gate driver TFT until the semiconductor film formed below the contact layer is exposed; and forming, while covering the region for forming the dual gate type gate driver TFT with a second mask, a source and a drain on the sequentially layered structure in the region for forming the bottom gate type pixel TFT, and then etching an exposed part of the contact layer which is not covered with the source and drain of the bottom gate type pixel TFT until the semiconductor film formed below the contact layer is exposed, to form a low mobility layer on an exposed semiconductor film surface which is not covered with the source and drain of the bottom gate type pixel TFT.

The above-mentioned structures are merely given as examples, and the present invention can be modified to suit individual cases without departing from its technical concept. Other structural examples of the present invention than the above-mentioned structures become clear from the entire description herein or the accompanying drawings.

According to the thus structured image display device and image display device manufacturing method, leakage in the pixel TFT can be suppressed and the driving power of the gate driver TFT can be improved.

Other effects of the present invention are revealed by reading the entire description herein.

DETAILED DESCRIPTION OF THE INVENTION

Embodiments of the present invention are described below with reference to the drawings. Throughout the drawings and the embodiments, the same or similar components are denoted by the same reference symbols in order to avoid repetitive description.

Figure 1:
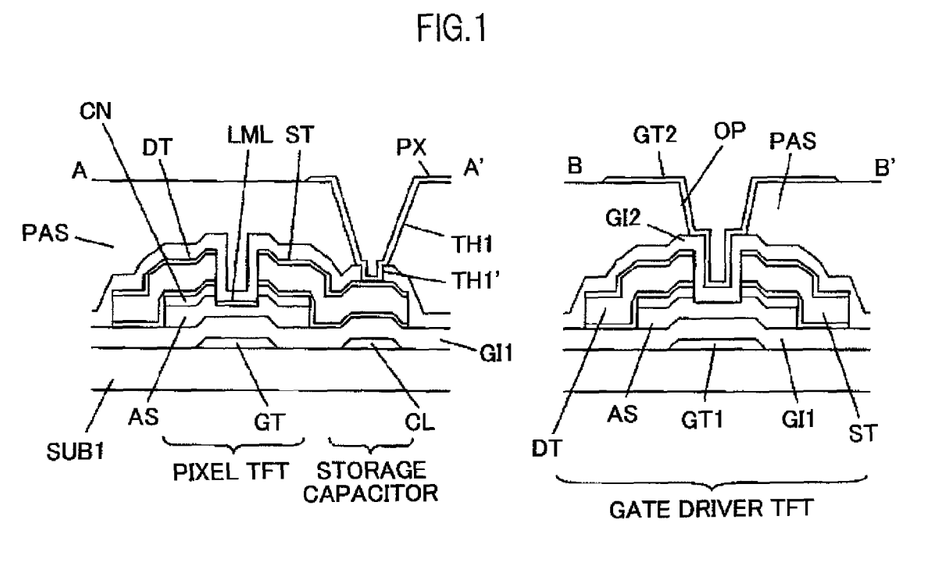
FIG. 1 is a cross-sectional view illustrating a pixel TFT and a gate driver TFT of an image display device according to a first embodiment of the present invention.

FIG. 1 is a cross-sectional view illustrating structures of a pixel TFT and gate driver TFT according to this embodiment. The pixel TFT is illustrated on the left-hand side of FIG. 1, and the gate driver TFT is illustrated on the right-hand side of FIG. 1. The cross-sectional view of the pixel TFT corresponds to a cross-sectional view taken along the line A-A' of FIG. 3 which is described later. The cross-sectional view of the gate driver TFT corresponds to a cross-sectional view taken along the line B-B' of FIG. 4 which is described later.

As illustrated in FIG. 1, the pixel TFT is a bottom gate TFT which has part of a gate line GL as a gate GT. The gate GT is provided on a substrate SUB1 made of, for example, glass, and a semiconductor film AS made of amorphous silicon is formed above the gate GT with a first gate insulator film GI1 interposed therebetween. The semiconductor film AS is connected to a drain DT and a source ST through a contact layer CN made of $n^+$ Si. The drain DT is connected to a drain line DL. The source ST is connected through a through hole TH1 a pixel electrode PX, which is a transparent electrode. The source ST is also connected to a storage capacitor that holds a voltage of the pixel electrode PX. The storage capacitor is formed of the above-mentioned source, a capacitor line CL, and the first gate insulator film GI1 as a dielectric film. A low mobility layer LML is formed on the semiconductor film AS of the pixel TFT to suppress leakage due to fixed charges of a passivation film PAS or other films above the pixel TFT, or due to an electric field from the pixel electrode PX.

The gate driver TFT is a dual gate TFT in which a first gate GT1 and a second gate GT2 are formed, respectively, below and above the semiconductor film AS made of amorphous silicon. The first gate GT1 is a metal film on the same layer as the gate GT of the pixel TFT, and faces the semiconductor film AS with the first gate insulator film GI1 interposed therebetween. The second gate GT2 is a transparent conductive film on the same layer as the pixel electrode PX. A region of the second gate GT2 that is located in an opening OP of the passivation film PAS faces the semiconductor film AS with a second gate insulator film GI2 alone interposed therebetween in order to facilitate induction of carriers. No low mobility layer is formed on a front side of the semiconductor film AS of the gate driver TFT, which gives the gate driver TFT a current driving power approximately twice larger than that of a bottom gate TFT of the same size. This means that the same driving power is obtained with a TFT approximately half in size, and a circuit width thereof can thus be reduced.

The mobility on the front side of the semiconductor film AS of the gate driver TFT is thus made larger than the mobility on the front side of the semiconductor film AS of the pixel TFT, thereby obtaining a structure that has both a driving power required of the gate driver TFT and low leakage properties required of the pixel TFT.

Figure 2:
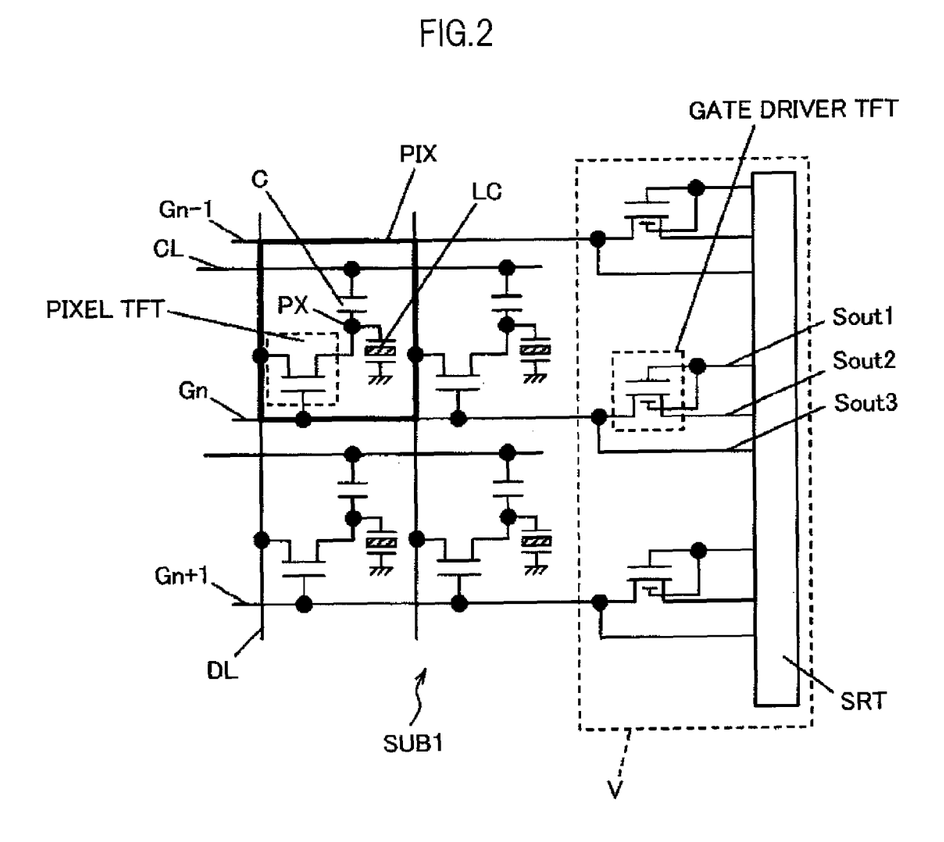
FIG. 2 is a diagram illustrating an equivalent circuit of the image display device according to the first embodiment.

FIG. 2 illustrates an example of an equivalent circuit of an image display device according to this embodiment. A plurality of intersecting drain lines DL and gate lines GL (Gn) are formed on the substrate SUB1, and pixel TFTs which serve as switches are formed near the intersections between the gate lines GL and the drain lines DL. The pixel TFTs are bottom gate TFTs which have the gate GT only below the semiconductor film AS, and have a low mobility layer formed on the front side of the semiconductor film AS. A gate driver circuit V which drives the gate lines GL is formed on the same substrate SUB1.

A storage capacitor C for holding the voltage of the pixel electrode PX is formed in each pixel PIX, and is connected to the capacitor line CL and the source ST of the pixel TFT. The drain DT of the pixel TFT is connected to one of the drain lines DL. The gate GT of the pixel TFT is connected to one of the gate lines GL. The gate line GL is connected to one of gate driver TFTs included in the gate driver circuit V. The gate driver circuit V selects the gate lines GL sequentially, one stage at a time, to apply a voltage VGH, which corresponds to ON voltage. When a pixel TFT that is connected to the selected gate line GL is turned on, a signal from the drain line DL is written in the storage capacitor C via the pixel TFT. After the signal is written, the pixel TFT is turned off by setting the voltage of the gate line GL to a voltage VGL, which corresponds to OFF voltage, and the voltage written in the storage capacitor C is held. An image is displayed by selecting the gate lines GL sequentially to write in pixels connected to the gate lines GL, causing the storage capacitor C of each pixel to hold a voltage that corresponds to the image, and applying the voltage to a liquid crystal LC.

The gate driver circuit V includes a shift register SRT and dual gate driver TFTs for applying the voltage VGH, at which the pixel TFTs are turned on, to the gate lines GL connected thereto. In each gate driver TFT, a high voltage that turns the TFT on is applied to its gate GT for a period in which its connected gate line is selected. For example, during a period in which the n-th gate line Gn is selected, a high voltage equal to or higher than the voltage VGH is applied from a node Sout1 of the shift register to the gate driver TFT that is connected to the gate line Gn. With the gate line Gn being selected, a high voltage is also applied to a node Sout2 of the shift register that is connected to the drain of the gate driver TFT, and the voltage VGH is output to the source of the gate driver TFT. After writing in the pixel that is connected to the gate line Gn is finished, the node Sout2 of the shift register is set to a low voltage, and the voltage VGL, at which the pixel TFT connected to the gate line Gn is turned off, is applied to the gate line Gn via the gate driver TFT. When the next stage gate line, namely, a gate line Gn+1, is selected, a low voltage is applied to the node Sout1 to turn off the gate driver TFT connected to the preceding stage gate line Gn, and the gate driver TFT is kept turned off until the next time the gate line Gn is selected. The gate driver TFT is also connected at its source to a node Sout3 of the shift register. During a period in which the gate line Gn is not selected, the voltage VGL for turning off the pixel TFT that is connected to the gate line Gn is output to the node Sout3. Similar voltage application is performed for the rest of the gate lines sequentially. The gate driver TFTs are required to charge and discharge the gate lines GL in a short period of time and, conventionally, would have needed to be large in size in order to provide a large driving power. In the liquid crystal display device of this embodiment, the TFT size can be reduced down to approximately half the conventional one by using a TFT that has an approximately twice larger driving power per unit area, while leakage in a pixel TFT is suppressed. This is accomplished by employing as a gate driver TFT a dual gate TFT that is high in mobility on the front side of the semiconductor film AS on the same substrate SUB1 as the pixel TFT. In a gate driver circuit formed of amorphous silicon TFTs which are low in mobility, in particular, the size of gate driver TFTs determines the circuit width, and thus downsizing the TFTs in this part guarantees a reduction in circuit width.

Figure 3:
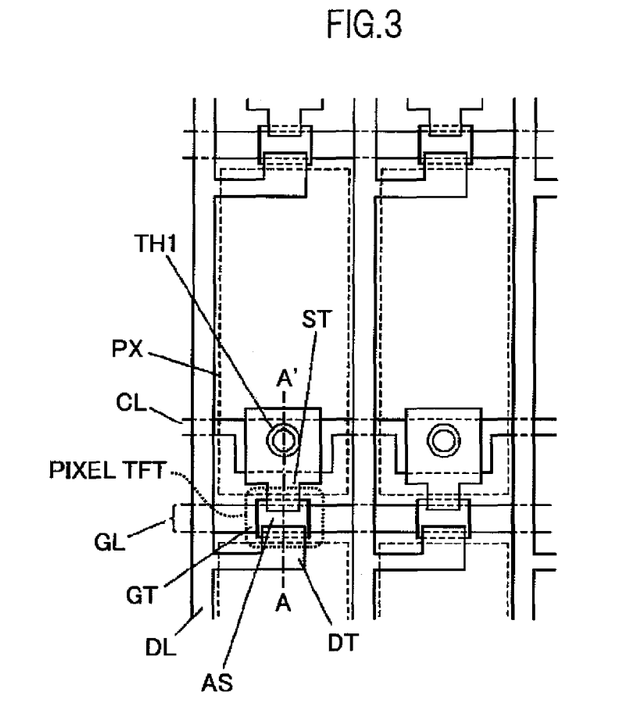
FIG. 3 is a plan view illustrating a pixel of the image display device according to the first embodiment.

FIG. 3 is a plan view of a pixel which is formed on the TFT substrate side of the image display device according to this embodiment. FIG. 3 illustrates a so-called vertical electric field type liquid crystal display device in which the liquid crystal LC is held between a TFT substrate (corresponding to the substrate SUB1 of FIG. 1) and a counter substrate (not shown) and driven with a voltage that is applied between the pixel electrode PX formed on the TFT substrate and a counter electrode (not shown) formed on the counter substrate. A pixel including a pixel TFT is formed on the TFT substrate side. The pixel TFT uses part of the gate line GL as the gate GT. As described above, the semiconductor film AS, which is made of amorphous silicon and has the low mobility layer on its front side, is formed above the gate GT. The semiconductor film AS is connected through the contact layer CN to the drain DT and the source ST. The drain DT is connected to the drain line DL and the source ST is connected to the storage capacitor C and the pixel electrode PX. A cross-sectional view taken along the line A-A' of FIG. 3 corresponds to the left-hand side diagram of FIG. 1, as described above.

Figure 4:
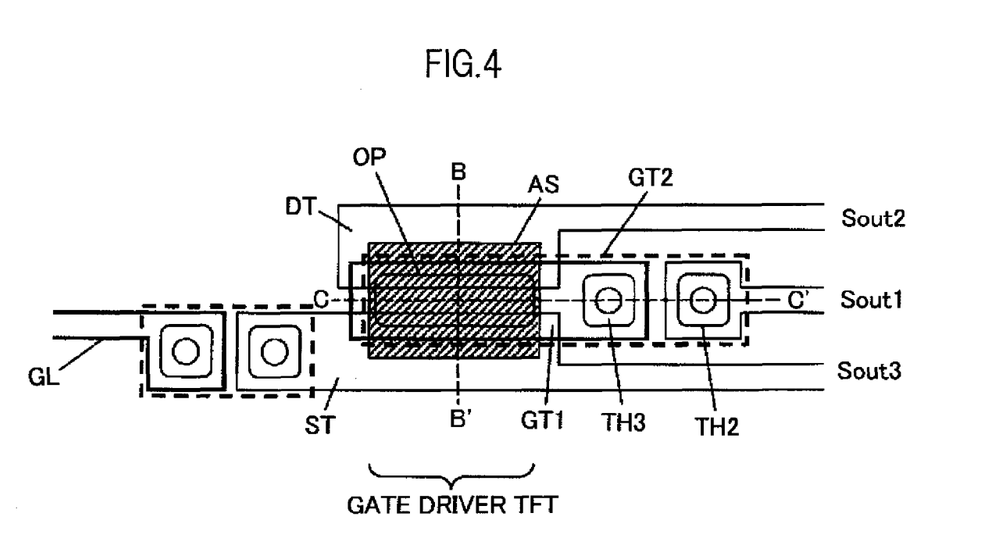
FIG. 4 is a plan view illustrating the gate driver TFT of the image display device according to the first embodiment.
Figure 5:
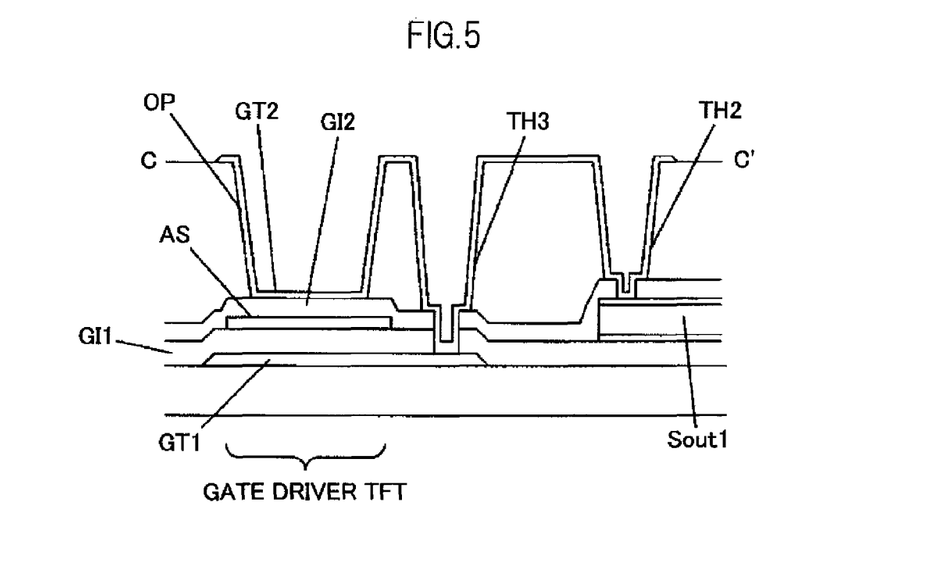
FIG. 5 is a diagram illustrating a cross section taken along line C-C' of FIG. 4.

FIG. 4 is a plan view illustrating a gate driver TFT in the gate driver circuit V on the TFT substrate side of the image display device according to this embodiment. As described above, a cross-sectional view taken along the line B-B' of FIG. 4 corresponds to the right-hand side diagram of FIG. 1. FIG. 5 is a cross-sectional view taken along the line C-C' of FIG. 4.

In the gate driver TFT, the first gate GT1 is formed below the semiconductor film AS, which is made of amorphous silicon, with the first gate insulator film GI1 interposed between AS and GT1, and the second gate GT2 is formed in the opening OP of the passivation film PAS above the semiconductor film AS with the second gate insulator film GI2 interposed between AS and GT2. No low mobility layer is formed on the semiconductor film AS. The second gate GT2 is formed of a conductive film on the same layer as the transparent electrode which serves as the pixel electrode PX, and is connected to the node Sout1 of the shift register SRT through a through hole TH2, which is formed in the passivation film PAS and in the second gate insulator film GI2. The first gate GT1 is connected to the second gate GT2 through a through hole TH3, which is formed in the passivation film PAS and in the first and second gate insulator films GI1 and GI2. The drain DT of the gate driver TFT is connected to the node Sout2 of the shift register SRT. The source ST of the gate driver TFT is connected to the node Sout3, and connected to the gate line GL through a conductive film on the same layer as the second gate GT2.

FIGS. 6 to 11 are diagrams illustrating step by step an example of how the pixel TFT and gate driver TFT of FIG. 1 are manufactured. As in FIG. 1, a manufacturing method for the pixel TFT is illustrated on the left-hand side of the diagrams and a manufacturing method for the gate driver TFT is illustrated on the right-hand side of the diagrams.

Figure 6:
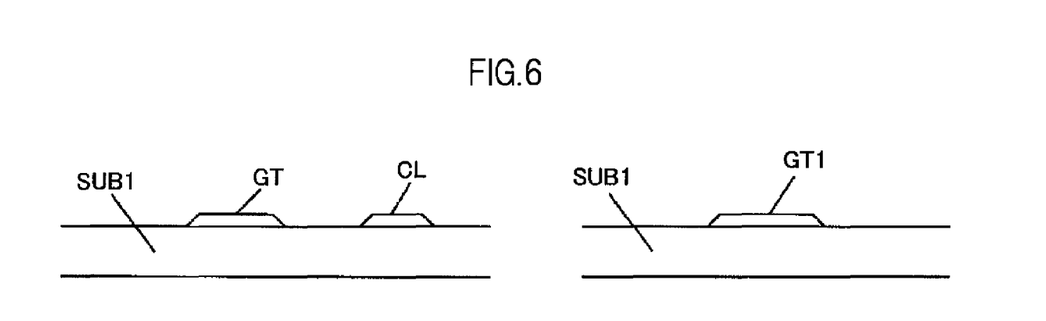
FIG. 6 is a diagram illustrating a first step of an image display device manufacturing method according to the first embodiment.

First, in FIG. 6, an Mo alloy is deposited by sputtering on a top surface of the substrate SUB1, which is made of, for example, glass, and the resultant film is processed by photolithography to form the gate GT of the pixel TFT, the capacitor line CL, and the first gate GT1 of the gate driver TFT.

Figure 7:
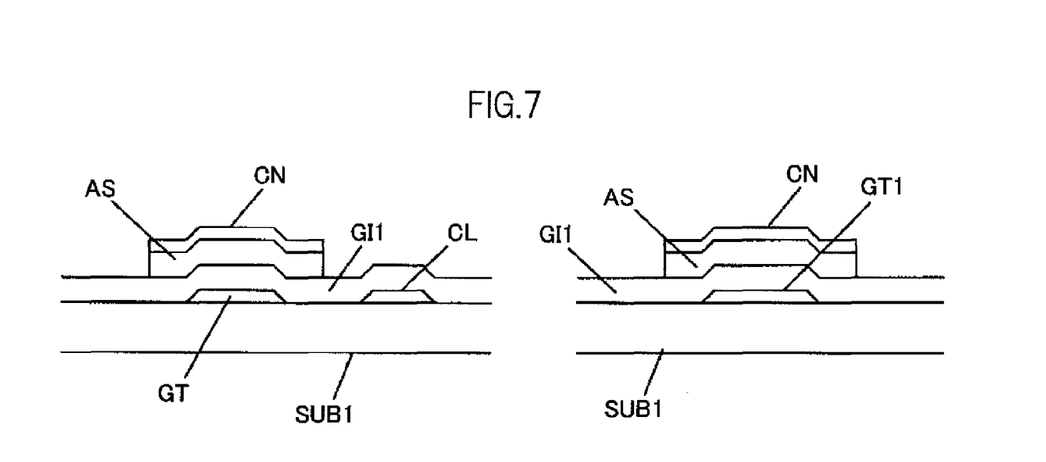
FIG. 7 is a diagram illustrating a second step of the image display device manufacturing method according to the first embodiment.

Next, as illustrated in FIG. 7, the first gate insulator film GI1, which is made of, for example, SiN, the semiconductor film AS, which is made of amorphous silicon, and the contact layer CN, which is an $n^+$ Si film made of phosphorus-containing amorphous silicon, are sequentially formed by plasma CVD. The semiconductor film and the contact layer are subsequently processed by photolithography to have a shape illustrated in FIG. 7.

Figure 8:
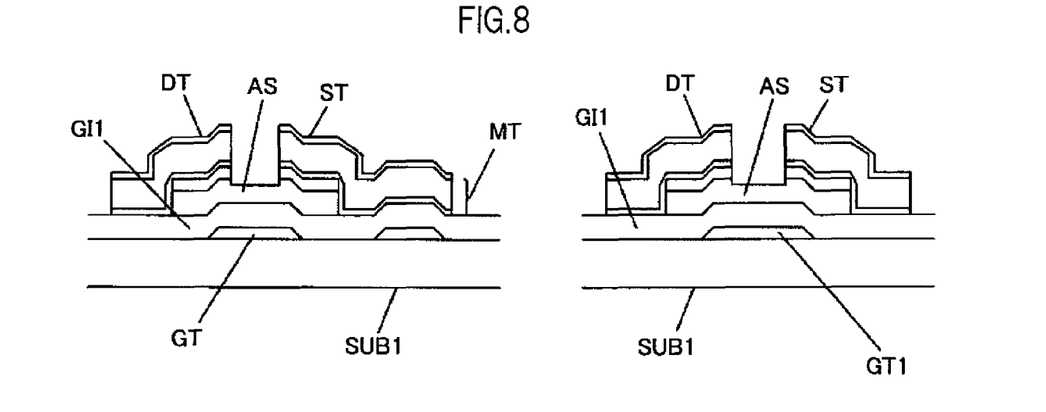
FIG. 8 is a diagram illustrating a third step of the image display device manufacturing method according to the first embodiment.

Next, as illustrated in FIG. 8, a three-layer metal film MT in which an Al alloy layer is sandwiched between Mo alloy layers is formed by deposition through sputtering. The metal film MT is processed by photolithography to form the source ST and drain DT of the pixel TFT and source ST and drain DT of the gate driver TFT. The contact layer CN is etched with resist (not shown) that is used for the processing of the drains DT and the sources ST being used as a mask. Part of the semiconductor film is also etched during the etching of the contact layer CN.

Figure 9:
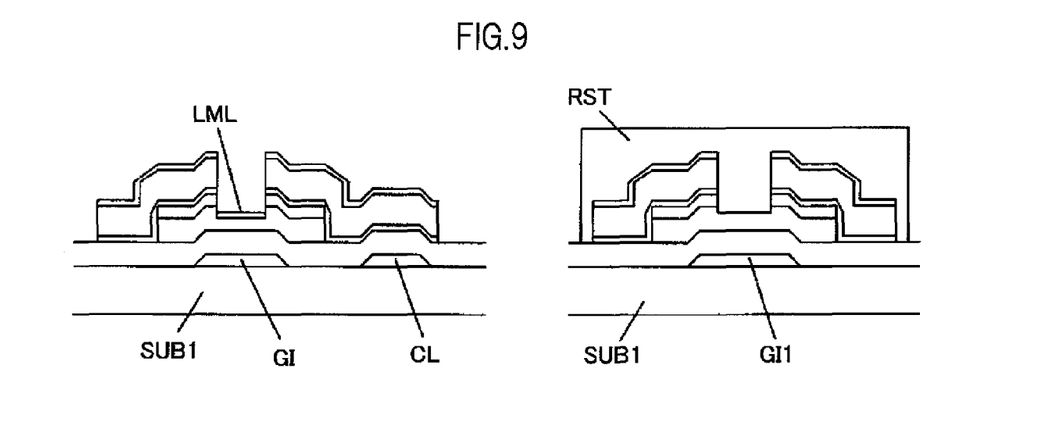
FIG. 9 is a diagram illustrating a fourth step of the image display device manufacturing method according to the first embodiment.

As illustrated in FIG. 9, a photoresist film RST is then used to form a resist pattern that covers the gate driver TFT side while exposing the pixel TFT side. With the photoresist film RST being used as a mask, a front side (exposed surface between the drain DT and the source ST) of the semiconductor film AS of the pixel TFT is irradiated with, for example, hydrogen plasma to form the low mobility layer LML.

Figure 10:
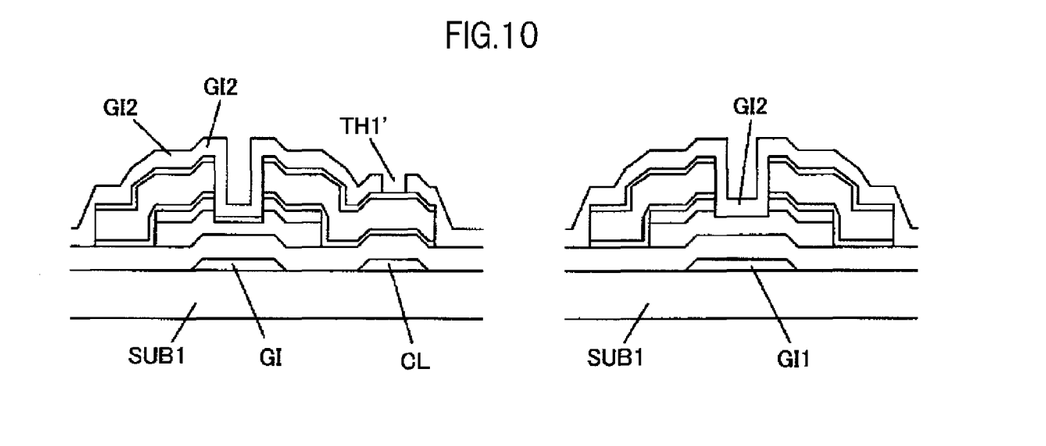
FIG. 10 is a diagram illustrating a fifth step of the image display device manufacturing method according to the first embodiment.

Next, as illustrated in FIG. 10, the second gate insulator film GI2, which is made of, for example, SiN, is formed by plasma CVD, and subsequently processed by photolithography to form in the pixel TFT a through hole TH1', which is provided for connecting with the pixel electrode PX.

Figure 11:
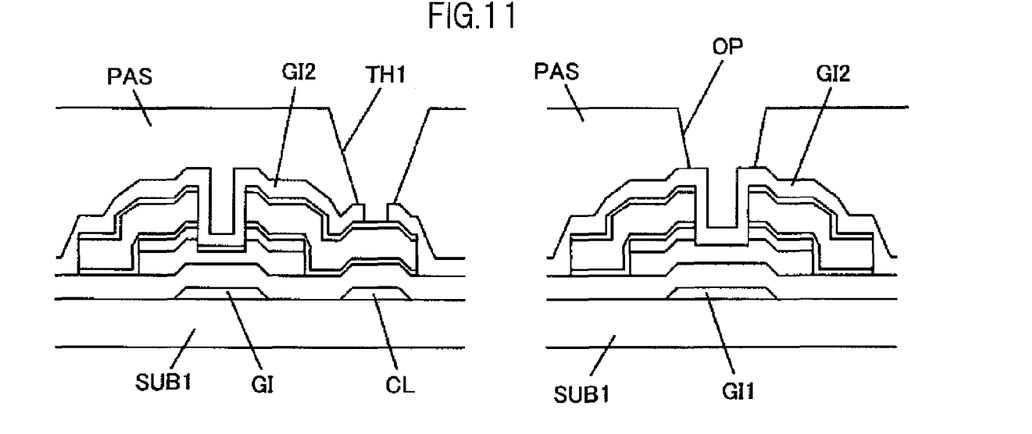
FIG. 11 is a diagram illustrating a sixth step of the image display device manufacturing method according to the first embodiment.

Thereafter, as illustrated in FIG. 11, a photosensitive transparent organic material capable of reducing a capacitance between the pixel electrode and a wiring line is applied to form the passivation film PAS. The passivation film PAS is exposed to light and developed, to thereby form the through hole TH1 on the pixel TFT side. The through hole TH1 is formed to be concentric with the through hole TH1', which has been formed in the second gate insulator film GI2. On the gate driver TFT side, the opening OP is formed to make the space above the semiconductor film AS open. Lastly, indium-tin-oxide (ITO) is deposited by sputtering to form a transparent electrode, which is processed by photolithography into the pixel electrode PX and the second gate GT2. The pixel TFT and the gate driver TFT structured as illustrated in FIG. 1 are thus obtained.

This embodiment uses hydrogen plasma treatment to form the low mobility layer LML. However, other methods including He plasma treatment and Ar plasma treatment may be employed instead.

Figure 12:
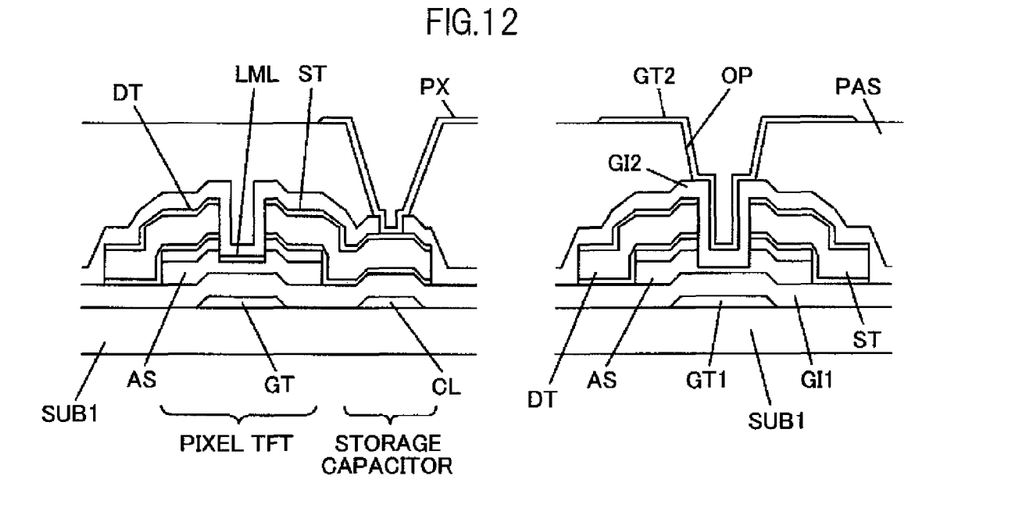
FIG. 12 is a cross-sectional view illustrating a pixel TFT and a gate driver TFT of an image display device according to a second embodiment of the present invention.

FIG. 12 is a cross-sectional view illustrating a pixel TFT and a gate driver TFT according to a second embodiment of the present invention, and is drawn in a corresponding manner to FIG. 1. The pixel TFT has, as in FIG. 1, the low mobility layer LML formed on the front side of the semiconductor film AS. The semiconductor film AS is formed thinner in regions that are not covered with the source ST and drain DT of the gate driver TFT than in regions that are not covered with the source ST and drain ST of the pixel TFT, and a part of the semiconductor film AS of the gate driver TFT including the low mobility layer that is formed temporarily in the process of this embodiment is removed. Also in this embodiment, the mobility on the front side of the semiconductor film AS of the gate driver TFT is higher than the mobility on the front side of the semiconductor film AS of the pixel TFT, and the gate driver TFT which is a dual gate TFT having a large driving power and the pixel TFT that is reduced in leakage can be formed on the same substrate SUB1.

Figure 13:
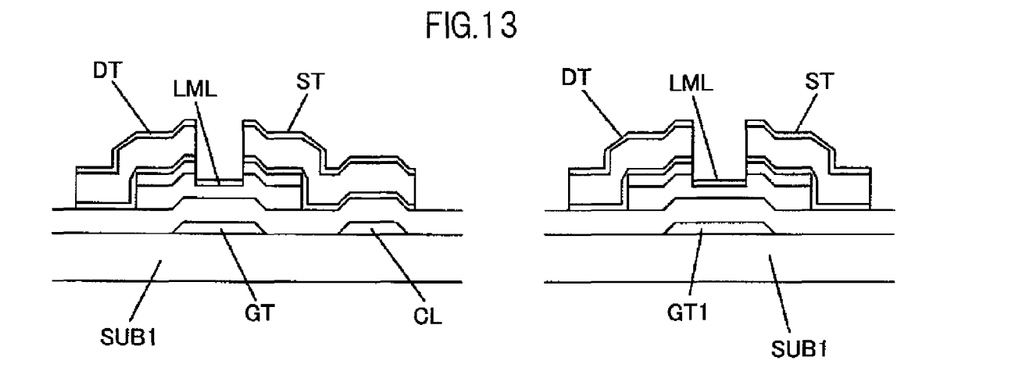
FIG. 13 is a diagram illustrating a step in an image display device manufacturing method according to the second embodiment.
Figure 14:
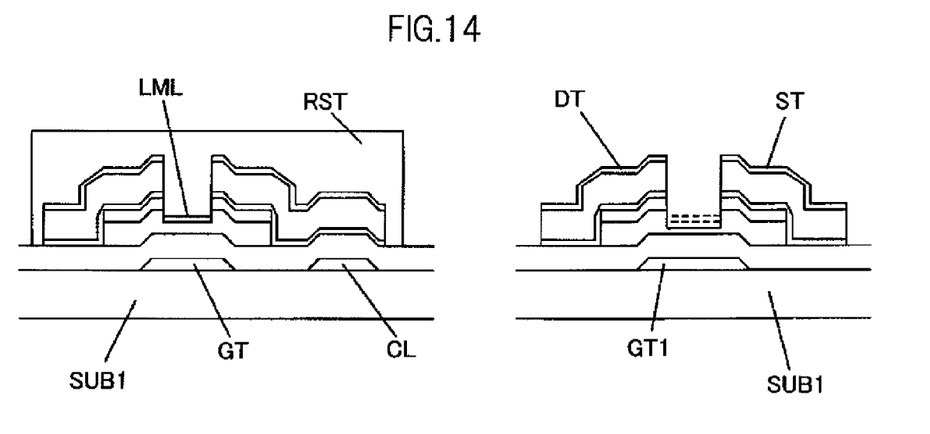
FIG. 14 is a diagram illustrating a step in the image display device manufacturing method according to the second embodiment.

FIGS. 13 and 14 each illustrate one of manufacturing steps for the pixel TFT and gate driver TFT of FIG. 12.

After the same steps as those described above with reference to FIGS. 6 to 8 are performed, plasma treatment is performed to form the low mobility layer LML on an entire surface of the semiconductor film AS. A low mobility layer is thus formed on the exposed front side of the semiconductor film AS in the pixel TFT and the gate driver TFT, whereby a structure illustrated in FIG. 13 is obtained. Subsequently, as illustrated in FIG. 14, the photoresist RST that covers the pixel TFT and exposes the gate driver TFT is formed to etch the low mobility layer LML on the front side of the semiconductor film AS of the gate driver TFT. At this point, part of the semiconductor film AS is also etched, and a surface that is higher in mobility than the low mobility layer LML is formed as a result of the etching. In this embodiment, for example, the semiconductor film AS and the contact layer CN are formed to 200 nm and 30 nm, respectively, and, in the step of FIG. 8, the contact layer CN is removed and 50 nm of the semiconductor film AS is etched away to make the thickness of the semiconductor film AS be 150 nm in regions that are not covered with the source ST and the drain DT. The low mobility layer LML is formed to 20 nm or so, for example. As illustrated in FIG. 14, the semiconductor film AS including the low mobility layer LML is etched further by 50 nm, whereby the thickness of the semiconductor film AS of the gate driver TFT is 100 nm in regions that are not covered with the source ST and the drain DT. Next, the same steps as those of FIGS. 10 and 11 are performed to obtain a structure illustrated in FIG. 12. In this embodiment, the semiconductor film AS is made thin and accordingly reduced in total count of defects within the film. Therefore, there is an advantage that a lower voltage is required to drive a gate driver TFT.

Figure 15:
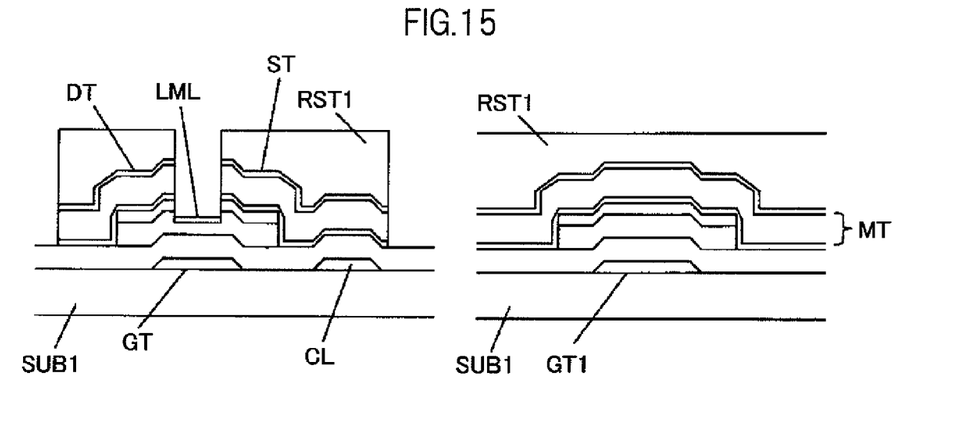
FIG. 15 is a diagram illustrating a step in an image display device manufacturing method according to a third embodiment of the present invention.
Figure 16:
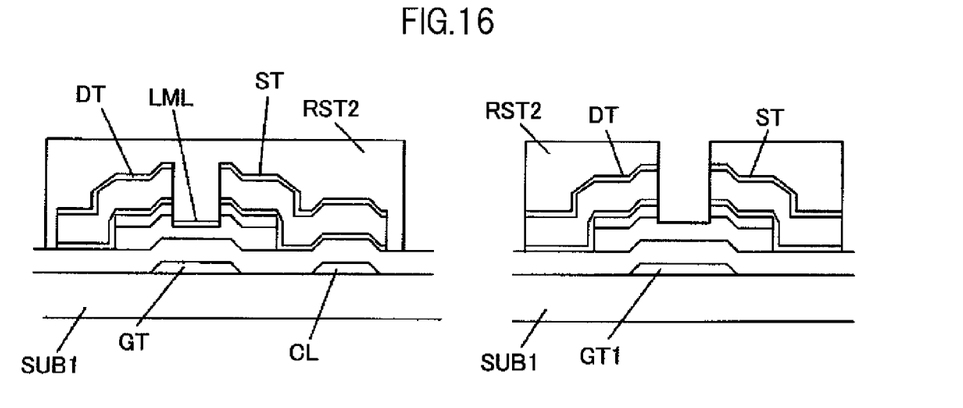
FIG. 16 is a diagram illustrating a step in the image display device manufacturing method according to the third embodiment.

FIGS. 15 and 16 are diagrams illustrating a method of manufacturing a pixel TFT and a gate driver TFT according to a third embodiment of the present invention, and each illustrate one of manufacturing steps for the pixel TFT and the gate driver TFT.

After the structure described above with reference to FIG. 7 is formed, the three-layer metal film MT made up of a Mo alloy layer and Al alloy layers is formed by deposition through sputtering as in the above description. As illustrated in FIG. 15, photoresist RST1 is formed for processing with which the source ST and drain DT of the pixel TFT are formed while a region that is to become the gate driver TFT is covered. The metal film MT is etched in this state. The exposed part of the contact layer CN and part of the semiconductor film AS are also etched, and then plasma treatment is performed to form the low mobility layer LML on the front side of the semiconductor film AS of the pixel TFT. Next, as illustrated in FIG. 16, the photoresist RST1 is removed and then photolithography process is performed again to form photoresist RST2, which covers the pixel TFT in order to form the source ST and drain DT of the gate driver TFT. Thereafter, the metal film MT, the contact layer CN, and part of the semiconductor film AS are etched, and the steps of FIG. 10 and subsequent steps are executed. A structure that makes the mobility on the front side of the semiconductor film of the gate driver TFT larger than the mobility on the front side of the semiconductor film of the pixel TFT is thus obtained.

In this embodiment, the semiconductor film AS of the pixel TFT and the semiconductor film AS of the gate driver TFT are etched independently of each other. This embodiment can therefore improve characteristics in the same manner as in FIG. 12, in which the semiconductor film AS of the gate driver TFT is made thinner in regions that are not covered with the source ST and the drain DT than the semiconductor film AS of the pixel TFT formed in regions that are not covered with the source ST and the drain DT. In addition, the semiconductor film AS of the pixel TFT and semiconductor film AS of the gate driver TFT are each etched only once in regions that are not covered with the source ST and the drain DT. This gives the third embodiment an advantage of improved precision with respect to the thickness of the semiconductor film AS over the case of FIGS. 13 and 14, in which the gate driver TFT is etched a plurality of times. The same advantage is obtained also when this embodiment is reversed by forming the source ST and drain DT of the gate driver TFT first with the use of a resist pattern that covers a region allocated to the pixel TFT, and then forming the source ST and drain DT of the pixel TFT as well as a low mobility layer on the front side of the semiconductor film AS of the pixel TFT, with the use of a resist pattern that covers the gate driver TFT.

Figure 17:
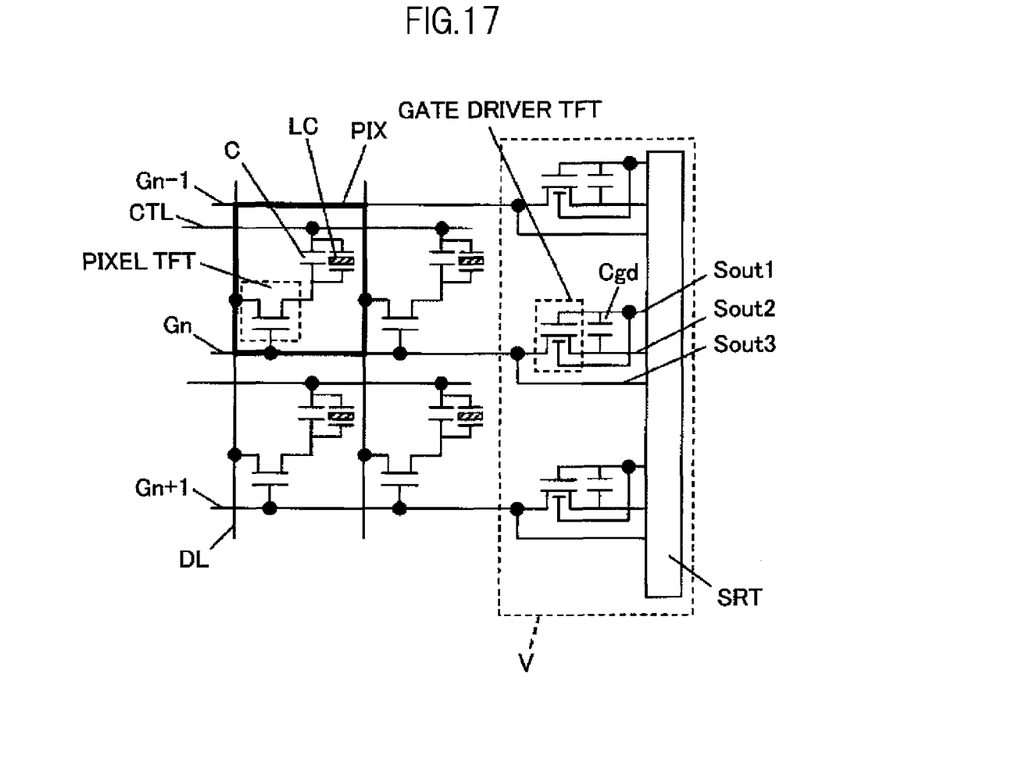
FIG. 17 is a diagram illustrating an equivalent circuit of an image display device according to a fourth embodiment of the present invention.

FIG. 17 illustrates an example of an equivalent circuit of a horizontal electric field type (in-plane-switching type) liquid crystal display device according to a fourth embodiment of the present invention, and is drawn in a corresponding manner to FIG. 2. As in FIG. 2, a pixel and the gate driver circuit V which are formed of TFTs are formed on the same substrate SUB1. In the horizontal electric field type liquid crystal display device, the pixel electrode PX and a counter electrode CT are both formed on the TFT substrate SUB1 side. A voltage applied to the counter electrode CT through a counter voltage line CTL serves as a reference for a voltage applied to the pixel electrode PX. A storage capacitor is formed between the pixel electrode PX and the counter electrode CT. A pixel TFT is formed in the pixel PIX. The low mobility layer LML is formed on the front side of the semiconductor film AS of the pixel TFT. A gate driver TFT of dual gate type is formed in the gate driver circuit V to control the gate line GL with an output from the shift register SRT. No low mobility layer is formed on the front side of the semiconductor film AS of the gate driver TFT, and the mobility on the front side of the semiconductor film AS of the gate driver TFT is higher than the mobility on the front side of the semiconductor film AS of the pixel TFT. The node Sout1 of the shift register SRT is connected to the lower gate GT1 and upper gate GT2 of the gate driver TFT. A capacitor Cgd is formed between the Sout1 and the drain DT of the gate driver TFT. The capacitor Cgd has a function of holding a voltage that is output from Sout1. For example, when a gate line Gn-1 is selected, the high voltage VGH is applied from Sout1 to the lower and upper gates GT1 and GT2 of the gate driver TFT that is connected to the next stage gate line, namely, the gate line Gn, and the low voltage VGL is applied to the drain line DL, whereby a potential difference VGH-VGL is held in the capacitor Cgd. When the gate line Gn is selected subsequently, the node Sout1 is set to a floating potential, and the high voltage VGH is applied to the node Sout2. At this point, owing to the capacitor Cgd, a voltage equal to or higher than VGH is applied from the node Sout2 to the lower and upper gates GT1 and GT2 of the gate driver TFT, and the high voltage VGH is applied to the gate line GL connected to the source ST. This method does not need to apply a voltage equal to or higher than VGH to the node Sout2, and therefore has an advantage that the same voltage as when a supply voltage circuit is not built in can be used. The method, however, requires an area for forming the capacitor Cgd.

Figure 18:
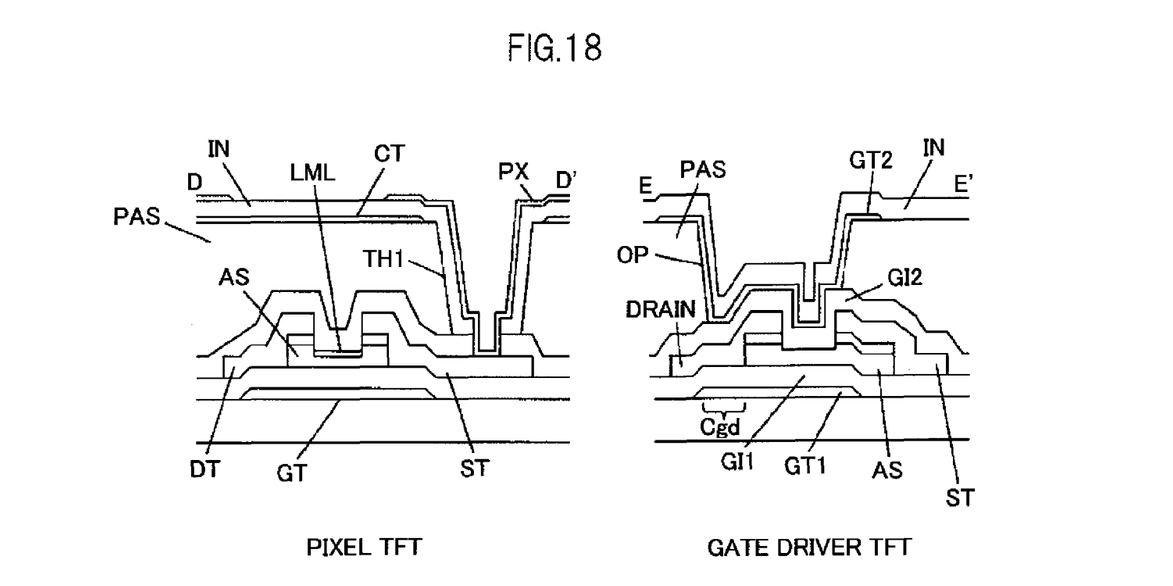
FIG. 18 is a cross-sectional view illustrating a pixel TFT and a gate driver TFT of an image display device according to a fourth embodiment of the present invention.

FIG. 18 is a cross-sectional view of the pixel TFT and the gate driver TFT illustrated in FIG. 17, and is drawn in a corresponding manner to FIG. 1. The pixel TFT is illustrated in cross section on the left-hand side of FIG. 18, and the cross-sectional view thereof corresponds to a view taken along the line D-D' of FIG. 19 which is described later. The gate driver TFT is illustrated in cross section on the right-hand side of FIG. 18, and the cross-sectional view thereof corresponds to a view taken along the line E-E' of FIG. 20 which is described later.

In FIG. 18, the low mobility layer LML is also formed on the front side of the semiconductor film AS of the pixel TFT, which is formed in each pixel, to thereby suppress leakage due to an electric field from the passivation film PAS and the counter electrode CT above the TFT.

The gate driver TFT is a dual gate TFT having the first gate GT1, which is formed of a metal film on the same layer as the gate GT of the pixel TFT, and the second gate GT2, which is formed of a transparent conductive film on the same layer as the counter electrode CT. The semiconductor film AS is formed above the first gate GT1 with the first gate insulator film GI1 interposed between AS and GT1. No low mobility layer is formed on the front side of this semiconductor film AS, which enables the second gate GT2 to improve the driving power of the gate driver TFT. The second gate GT2 has a region in the opening OP of the passivation film PAS which faces the semiconductor film AS with the second gate insulator film GI2, which is formed on the source ST and the drain DT, interposed between AS and GT2. The capacitor Cgd is formed between the drain DT and the first gate GT1 with the first gate insulator film GI1 interposed between DT and GT1. Another capacitor Cgd is formed between the drain DT and the second gate GT2 with the second gate insulator film GI2 interposed between DT and GT2. In the fourth embodiment, the capacitor Cgd is formed between the second gate GT2 and the drain DT in addition to between the first gate GT1 and the drain DT, and the capacitance per unit area is increased. Therefore, a smaller area is required to form capacitors. This gives the fourth embodiment an advantage that the circuit width is reduced.

Further, the pixel electrode PX and the counter electrode CT in the fourth embodiment can both be formed of, for example, an ITO film which is a transparent conductive film. The source ST and the drain DT can be formed of a single-layer metal film that has a high melting point and that is capable of forming a solid contact with $n^+$ Si and ITO, for example, a film of Cr, Mo, or W, or an alloy thereof. The first and second gate insulator films GI1 and GI2 and a capacitor insulator film IN can be formed of a SiN film formed by plasma CVD. Through steps substantially the same as those illustrated in FIGS. 6 to 11 (or FIGS. 13 and 14), the semiconductor film AS is formed so that the mobility on the front side of the semiconductor film AS of the gate driver TFT is higher than the mobility on the front side of the semiconductor film AS of the pixel TFT.

Figure 19:
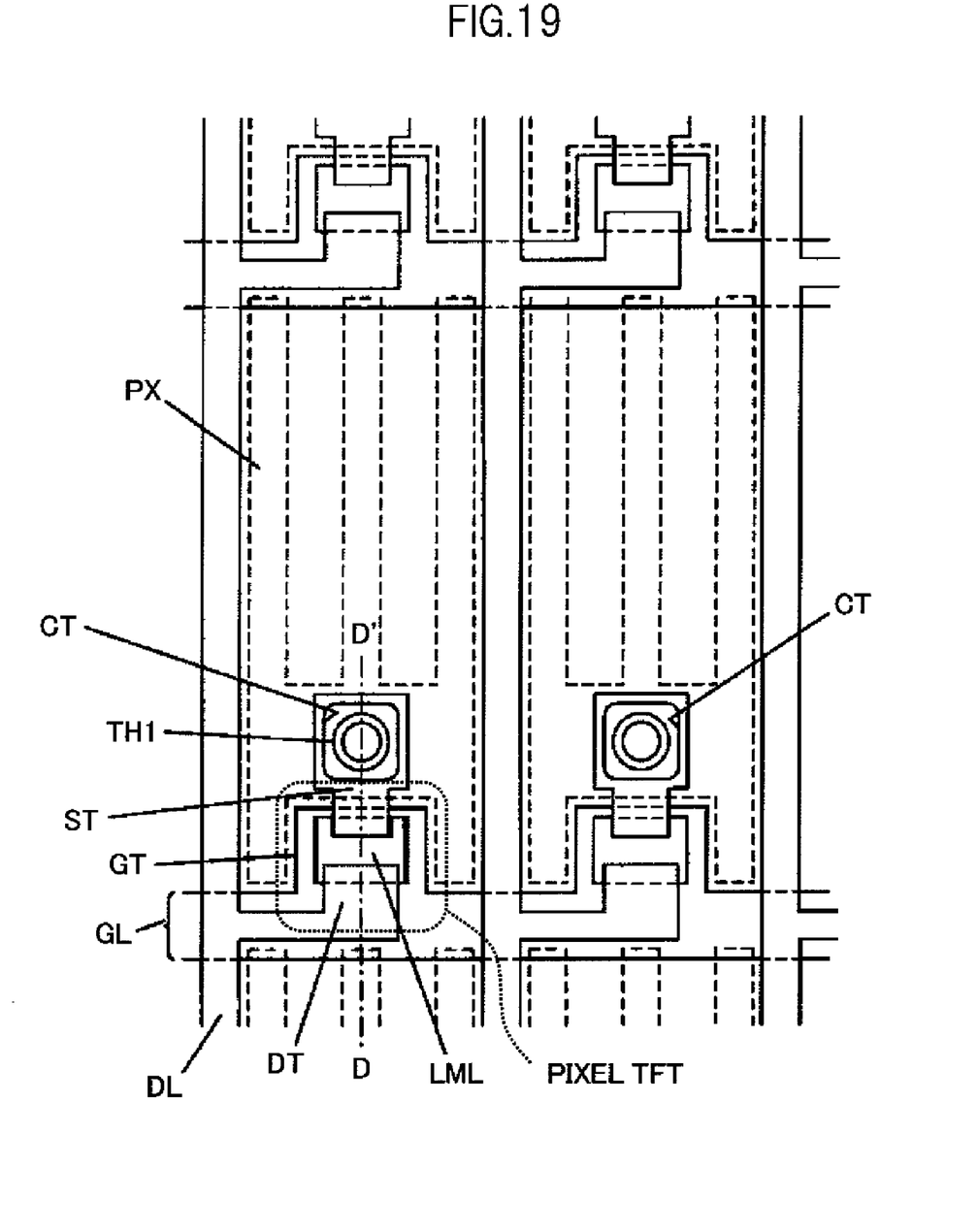
FIG. 19 is a plan view illustrating a pixel of the image display device according to the fourth embodiment.

FIG. 19 is a plan view of the pixel part of the TFT substrate of the horizontal electric field type liquid crystal display device which includes the pixel TFT illustrated in FIG. 18. As described above, a cross-sectional view taken along the line D-D' of FIG. 19 is the cross-sectional view on the left-hand side of FIG. 18. Also in the horizontal electric field type liquid crystal display device, a liquid crystal is held between the TFT substrate SUB1 and the counter substrate (not shown). An electric field is generated between the pixel electrode PX and the counter electrode CT, which are formed on the TFT substrate SUB1 side, and is applied to the liquid crystal to display an image. The pixel electrode PX has a comb-teeth shape in order to apply an in-plane direction electric field to the liquid crystal. The pixel electrode PX, together with the counter electrode CT which is formed below the pixel electrode PX, generates an electric field for driving the liquid crystal. A storage capacitor is formed between the pixel electrode PX and the counter electrode CT, with the capacitor insulator film IN interposed between PX and CT. The pixel electrode PX is connected to the source ST of the pixel TFT through an opening that is formed in the second gate insulator film GI2, the passivation film PAS, the counter electrode CT, and the capacitor insulator film IN. The gate GT and drain DT of the pixel TFT are connected to the gate line GL and the drain line DL, respectively.

Figure 20:
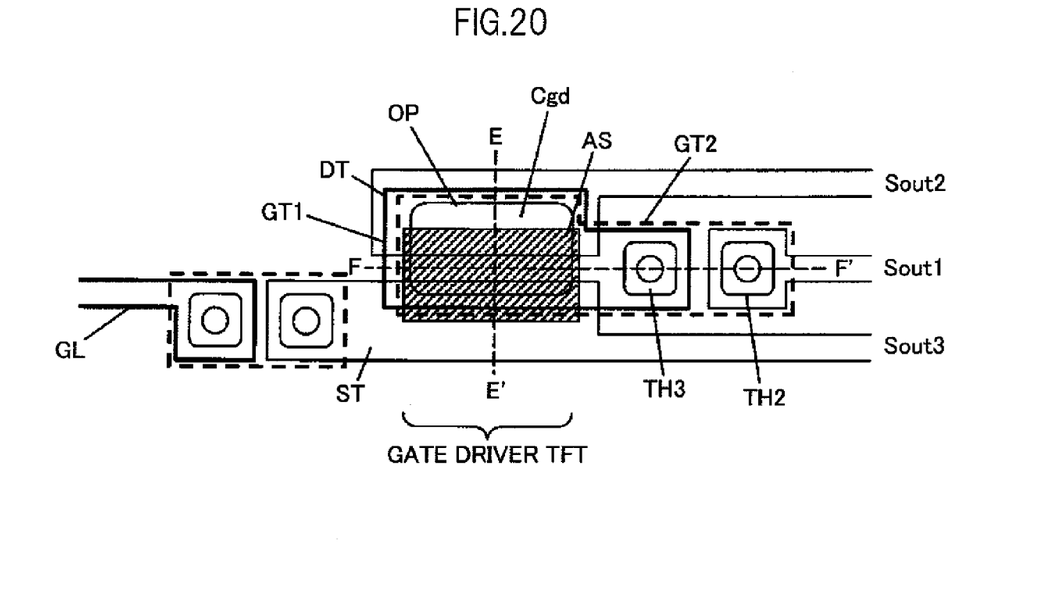
FIG. 20 is a plan view illustrating the gate driver TFT of the image display device according to the fourth embodiment.
Figure 21:
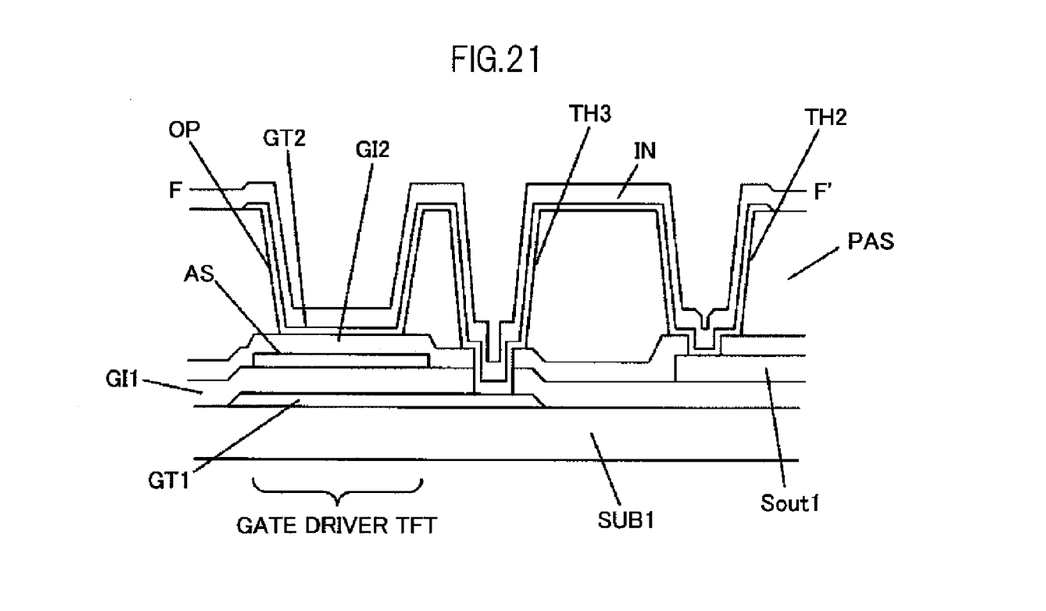
FIG. 21 is a cross-sectional view taken along line F-F' of FIG. 20.

FIG. 20 is a plan view of the gate driver circuit part of the TFT substrate which includes the gate driver TFT illustrated in FIG. 18. As described above, a cross-sectional view taken along the line E-E' of FIG. 20 is the right-hand side diagram of FIG. 18. FIG. 21 is a cross-sectional view taken along the line F-F' of FIG. 20.

In the gate driver TFT, the first gate GT1 is formed below the semiconductor film AS, which is made of amorphous silicon, with the first gate insulator film GI1 interposed between AS and GT1, and the second gate GT2 is formed in the opening OP of the passivation film PAS, which is formed above the semiconductor film AS and the drain DT, with the second gate insulator film GI2 interposed between AS and GT2. No low mobility layer is formed above the semiconductor film AS of the gate driver TFT. The second gate GT2 is formed of a conductive film on the same layer as the transparent electrode that serves as the counter electrode CT, and is connected to the node Sout1 of the shift register SRT through the through hole TH2, which is formed in the passivation film PAS and in the second gate insulator film GI2. The first gate GT1 is connected to the second gate GT2 through the through hole TH3, which is formed in the passivation film PAS and in the first and second gate insulator films GI1 and GI2. The drain DT of the gate driver TFT is connected to the node Sout2 of the shift register SRT. A capacitor is formed below the drain DT and between the drain DT and the first gate GT1, with the first gate insulator film GI1 interposed between DT and GT1. In the opening OP of the passivation film PAS, another capacitor is formed between the second gate GT2 and the drain DT, with the second gate insulator film GI2 interposed between GT2 and DT. The capacitors together function as the capacitor Cdg. The source ST of the gate driver TFT is connected to the node Sout3, and connected to the gate line GL through a conductive film on the same layer as the second gate GT2.

Also in the fourth embodiment, the mobility on the front side of the semiconductor film AS of the gate driver TFT is made higher than the mobility on the front side of the semiconductor film AS of the pixel TFT. Therefore, there is obtained an effect of reducing the TFT size and accordingly reducing the circuit width by increasing the driving power that is provided by the upper gate GT2 of the gate driver TFT, while suppressing leakage in the pixel TFT.

The fourth embodiment uses a transparent conductive film on the same layer as the counter electrode CT to form the second gate GT2 of the gate driver TFT. A transparent conductive film on the same layer as the pixel electrode PX may be employed instead. In this case, the second gate insulator film GI2 may be omitted by replacing GI2 with the capacitor insulator film IN as an insulator film between the second gate GT2 and the semiconductor film AS. The structure of the second gate GT2 and the second gate insulator film GI2 may be modified to suit individual cases as long as the pixel TFT and the gate driver TFT maintain their magnitude relation about the mobility on the front side of the semiconductor film AS.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An image display device, comprising, on a TFT substrate:
    a plurality of gate lines and a plurality of drain lines which intersect with each other;
    a pixel TFT provided within a pixel which is enclosed by a pair of adjacent gate lines and a pair of adjacent drain lines;
    a gate driver TFT which is connected to one of the plurality of gate lines to drive the one of the plurality of gate lines; and
    a shift register for selecting one of the plurality of gate lines through the gate driver TFT,
    wherein the pixel TFT and the gate driver TFT each include an amorphous semiconductor film as a channel,
    wherein the pixel TFT has a bottom gate structure in which a gate of the pixel TFT is formed below the amorphous semiconductor film,
    wherein the gate driver TFT has a dual gate structure in which a gate of the gate driver TFT is formed below the amorphous semiconductor film and another gate of the gate driver TFT is formed above the amorphous semiconductor film, and
    wherein a mobility on a top surface side of the amorphous semiconductor film of the gate driver TFT is higher than a mobility on a top surface side of the amorphous semiconductor film of the pixel TFT.

2. An image display device according to claim 1, wherein the pixel TFT and the gate driver TFT each include a contact layer which is interposed between a source thereof and the amorphous semiconductor film, and between a drain thereof and the amorphous semiconductor film.

3. An image display device according to claim 1, wherein a thickness of the amorphous semiconductor film formed in a region that is not covered with the source and drain of the pixel TFT is larger than a thickness of the amorphous semiconductor film formed in a region that is not covered with the source and drain of the gate driver TFT.

4. An image display device according to claim 1, wherein the TFT substrate faces a counter substrate across a liquid crystal.

5. An image display device according to claim 1, further comprising:
    a shift register arranged to select one of the plurality of gate lines, via the gate driver TFT,
    wherein each of the pixel TFT and the gate driver TFT further includes a contact layer interposed between a source thereof and the amorphous semiconductor film, and between a drain thereof and the amorphous semiconductor film.

6. An image display device according to claim 1, wherein a thickness of the amorphous semiconductor film formed in a region that is not covered with the source and drain of the pixel TFT is larger than a thickness of the amorphous semiconductor film formed in a region that is not covered with the source and drain of the gate driver TFT.

7. An image display device according to claim 1, wherein the substrate is arranged to face a counter substrate across a liquid crystal.

8. An image display device, comprising:
    a plurality of gate lines formed on a substrate;
    a plurality of drain lines formed on the substrate to intersect with the plurality of gate lines;
    a pixel thin-film transistor (TFT) disposed at an intersection between an adjacent gate line and an adjacent drain line on the substrate; and a gate driver thin-film transistor (TFT) connected to one of the plurality of gate lines to drive the one of the plurality of gate lines on the substrate;

wherein each of the pixel TFT and the gate driver TFT includes an amorphous semiconductor film as a channel formed on the substrate, wherein the pixel TFT has a bottom gate structure in which a gate of the pixel TFT is formed below the amorphous semiconductor film, wherein the gate driver TFT has a dual gate structure in which a first gate is formed below the amorphous semiconductor film and a second gate is formed above the amorphous semiconductor film, and wherein a mobility on a top surface side of the amorphous semiconductor film of the gate driver TFT is higher than a mobility on a top surface side of the amorphous semiconductor film of the pixel TFT so as to increase a driving power of the gate driver TFT while suppressing a leak current in the pixel TFT.

* * * * *